United States Patent
Guttmann et al.

(10) Patent No.: US 9,227,392 B2
(45) Date of Patent: Jan. 5, 2016

(54) SLIP SHEET REMOVAL

(71) Applicants: Yoel Guttmann, North Vancouver (CA); Gordon D. Andrew, Delta (CA)

(72) Inventors: Yoel Guttmann, North Vancouver (CA); Gordon D. Andrew, Delta (CA)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

(21) Appl. No.: 14/283,296

(22) Filed: May 21, 2014

(65) Prior Publication Data

US 2015/0336378 A1    Nov. 26, 2015

(51) Int. Cl.
| | |
|---|---|
| *B65H 3/12* | (2006.01) |
| *B65H 5/22* | (2006.01) |
| *B41F 21/00* | (2006.01) |
| *B65H 3/08* | (2006.01) |
| *B65H 5/08* | (2006.01) |
| *B65G 17/32* | (2006.01) |

(52) U.S. Cl.
CPC .............. *B41F 21/00* (2013.01); *B65H 3/0816* (2013.01); *B65G 17/323* (2013.01); *B65H 3/124* (2013.01); *B65H 5/085* (2013.01); *B65H 5/224* (2013.01); *B65H 2701/18264* (2013.01)

(58) Field of Classification Search
None
See application file for complete search history.

(56) References Cited

U.S. PATENT DOCUMENTS

| | | | | | |
|---|---|---|---|---|---|
| 3,584,866 | A | * | 6/1971 | Ross et al. | 271/12 |
| 3,682,469 | A | * | 8/1972 | Itoh et al. | 271/12 |
| 3,912,253 | A | * | 10/1975 | Jarman | 271/5 |
| 3,926,427 | A | * | 12/1975 | Moksnes et al. | 271/9.12 |
| 4,311,304 | A | * | 1/1982 | Hamada et al. | 271/13 |
| 5,655,452 | A | | 8/1997 | Blake et al. | |
| 6,422,801 | B1 | * | 7/2002 | Solomon | 271/9.11 |
| 6,688,591 | B2 | * | 2/2004 | Larsen et al. | 271/98 |
| 6,776,097 | B2 | * | 8/2004 | Takeda | 101/477 |
| 7,144,009 | B2 | * | 12/2006 | Kim | 271/276 |
| 7,604,231 | B2 | * | 10/2009 | Yuen et al. | 271/106 |
| 2006/0261537 | A1 | * | 11/2006 | Dangelewicz et al. | 271/106 |

FOREIGN PATENT DOCUMENTS

EP    1382552 A1 *  1/2004  ............. B65G 15/58

* cited by examiner

*Primary Examiner* — Jill Culler
(74) *Attorney, Agent, or Firm* — Nelson A. Blish; William R. Zimmerli

(57) ABSTRACT

A method of removing slip sheets from a printing plates stack is disclosed, wherein the slip sheets are interspersed between the printing plates includes moving at least two parallel energy chains. Each of the energy chains carries a plurality of vacuum cups over the stack of printing plates. The vacuum cups are attached to a top slip sheet placed on top of the printing plates stack and peel off sheets while vacuum is maintained and transferring the top slip sheet into a slip sheet bin.

9 Claims, 6 Drawing Sheets

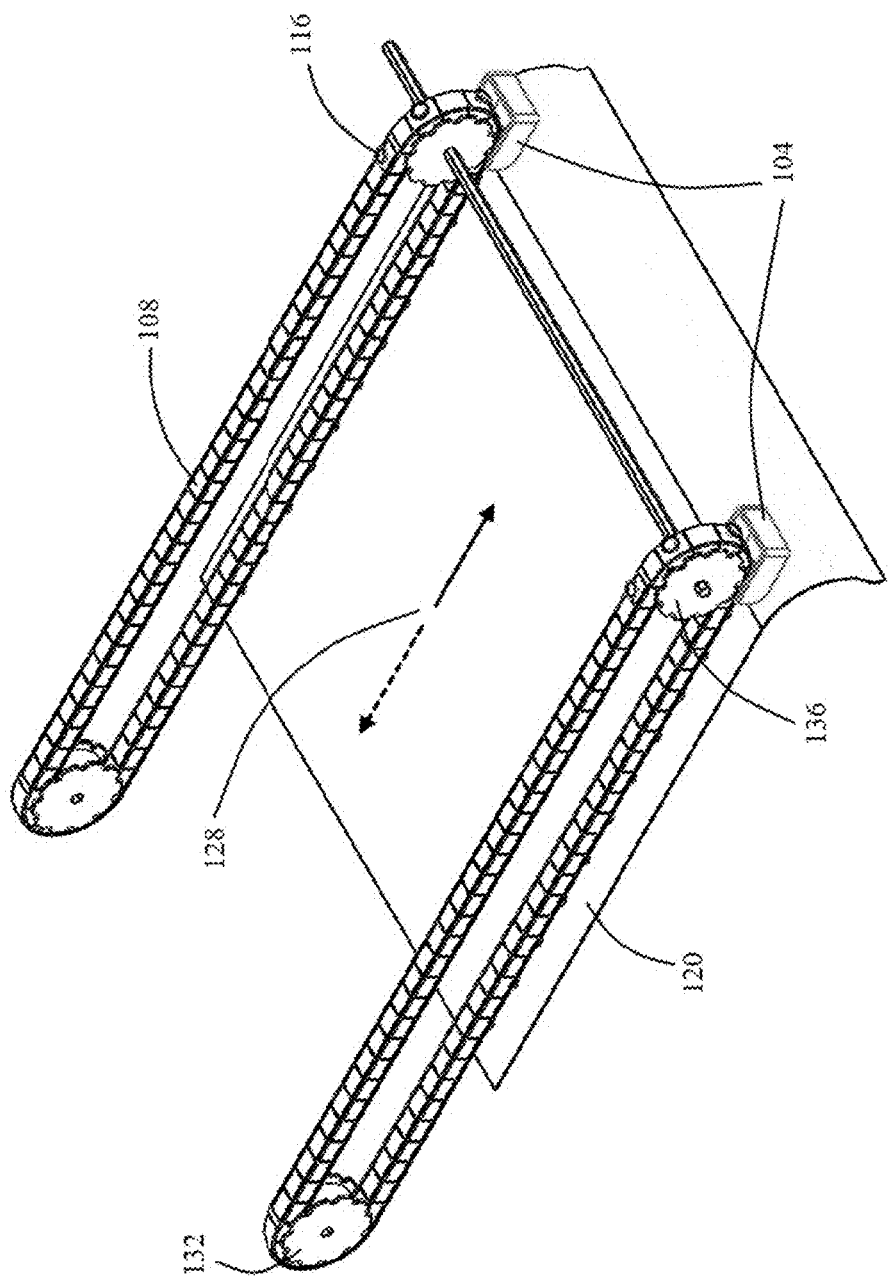

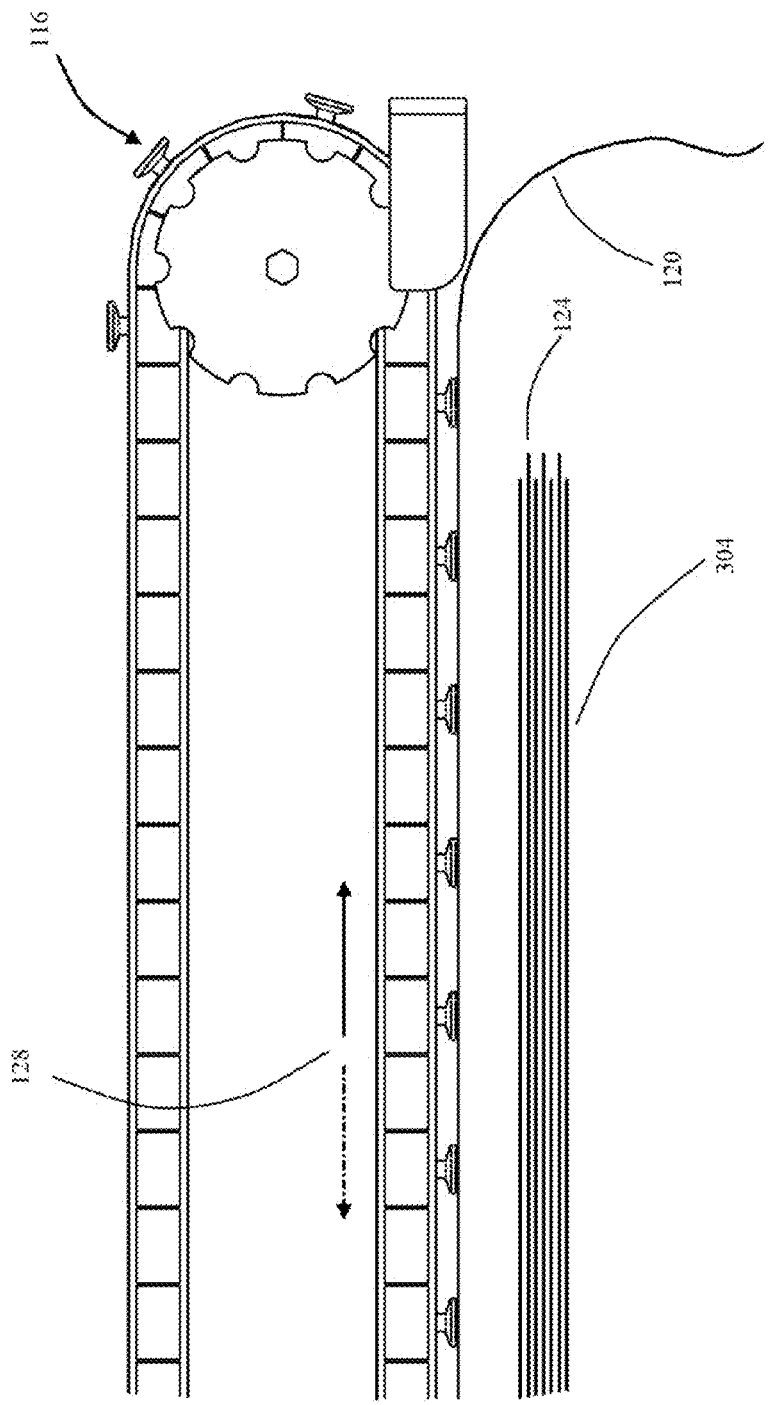

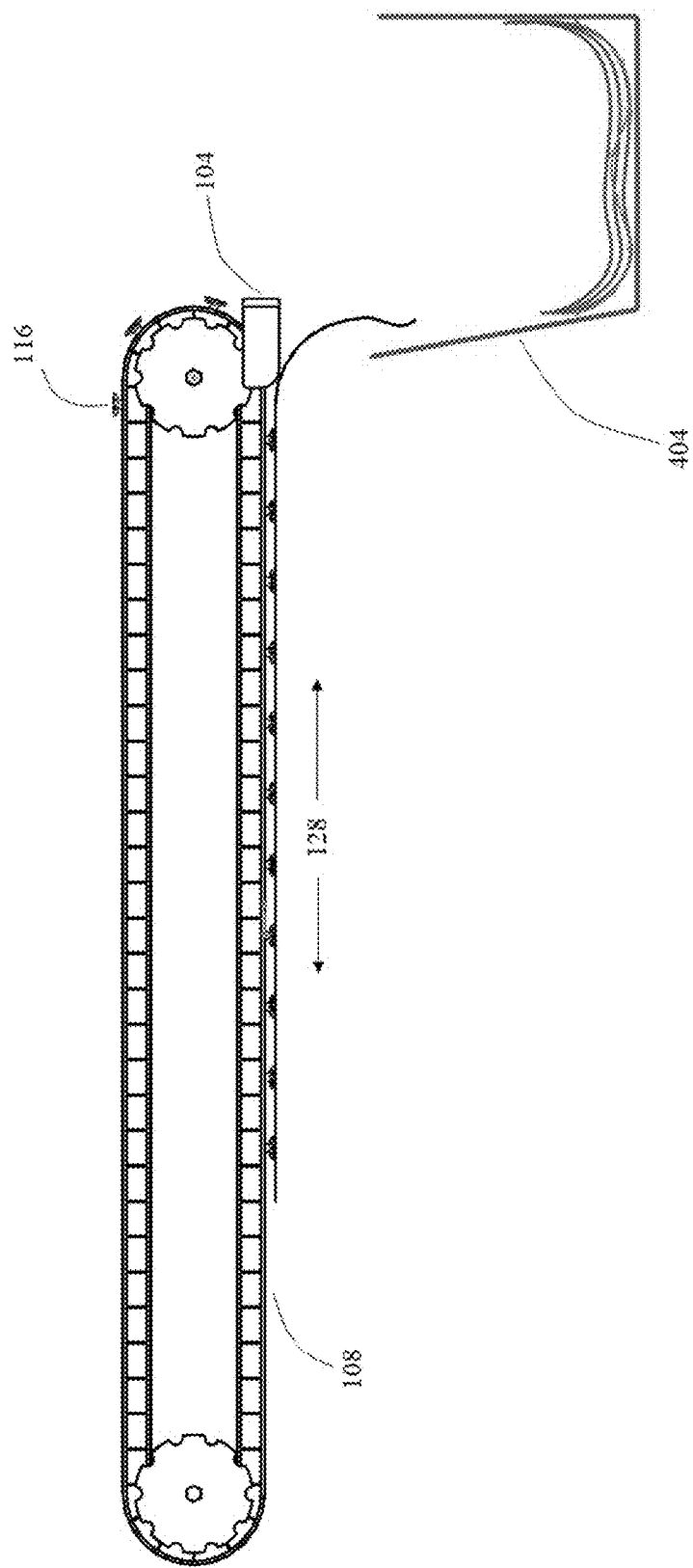

SLIP SHEET REMOVAL

CROSS REFERENCE TO RELATED APPLICATIONS

Reference is made to commonly-assigned copending U.S. patent application Ser. No. 14/283,306, filed May 21, 2014, entitled VACUUM CONVEYOR FOR REMOVING SLIP SHEETS, by Guttmann et al.; the disclosure of which is incorporated herein.

FIELD OF THE INVENTION

The invention relates to systems for handling flat sheets of media and more particularly to a system for holding and conveying a sheet from a stack of sheets.

BACKGROUND OF THE INVENTION

Plates, films, and proofing media for imaging systems, such as computer-to-plate (CTP) systems which are used in the graphic arts industry, are commonly stacked in boxes with slip sheet sheets interspersed between adjacent media sheets. The slip sheet primarily functions to protect the media surface from damage and to prevent adjacent media sheets from adhering to each other. The slip sheet is particularly important when the active emulsion on the media is either sticky or particularly sensitive to damage.

In the development of media for imaging tasks, particularly plates for lithographic printing operations, a number of often conflicting parameters such print run length, exposure sensitivity, exposure latitude and processing requirements must often be traded off against one another to achieve the best results. Some media have particularly good performance in relation to the abovementioned parameters, but suffer from extreme delicacy of the unexposed media emulsion. In a specific case, some LH-PI lithographic plates have a particularly delicate emulsion and may be scratched even by the action of removing the slip sheet. However, once exposed, the emulsion is durable and the plate images have good on-press performance.

Other commonly available media may have similar problems with delicate emulsion surfaces although, depending on the thickness and particular characteristics of the emulsion, scratches may or may not remain visible after subsequent processing. While not all media require special attention to how slip sheets are removed, the problem has been evident in a number of media products in the graphic arts industry.

In U.S. Pat. No. 5,655,452 (Blake et. al.) a slip sheet removal mechanism for removing a slip sheet from a plate is described. Briefly, the removal operates by activating peeler airflow to initiate separation between the slip sheet and the plate. A number of suction cups are pivoted into a location above the slip sheet and the stack of plates is moved to bring the slip sheet into engagement with the suction cups. A combination of movement of the plate stack and pivoting of the suction cups is used to separate the slip sheet and move it towards a pair of nip rollers that complete the removal operation.

There remains a need for better methods of handling slip sheets and there is a particular need for such a slip sheet removal mechanism that performs the removal without any damage to the media emulsion.

SUMMARY OF THE INVENTION

Briefly, according to one aspect of the present invention a method of removing slip sheets from a printing plates stack is disclosed, wherein the slip sheets are interspersed between the printing plates includes moving at least two parallel energy chains. Each of the energy chains carries a plurality of vacuum cups over the stack of printing plates. The vacuum cups are attached to a top slip sheet placed on top of the printing plates stack and peel off sheets while vacuum is maintained and transferring the top slip sheet into a slip sheet bin.

The invention and its objects and advantages will become more apparent in the detailed description of the preferred embodiment presented below.

BRIEF DESCRIPTION OF THE DRAWINGS

In order to understand the invention and to see how it may be carried out in practice, examples will now be described, by way of non-limiting descriptions only, with reference to the accompanying drawings, in which:

FIG. 1 illustrates a pair of adjustable lightweight energy chains with plurality of vacuum cups in process of removing slip sheet.

FIG. 3 shows a schematic illustration of a lightweight energy chains with plurality of vacuum cups removing a slip sheet from stack of printing plates;

FIG. 4 shows a schematic illustration of a lightweight energy chains holding plurality of vacuum cups moving the slip sheets into a bin.

DETAILED DESCRIPTION OF THE INVENTION

Figure 2A:
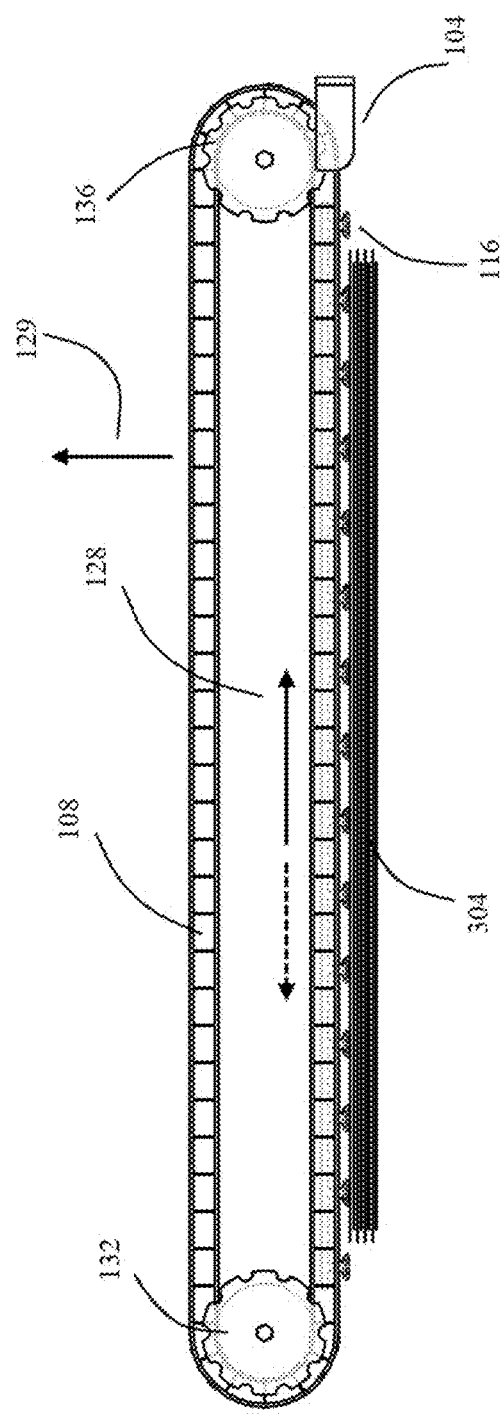
FIG. 2a shows a schematic illustration of a lightweight energy chains with plurality of vacuum cups attached to a slip sheet.

In the following detailed description, numerous specific details are set forth in order to provide a thorough understanding of the disclosure. However, it will be understood by those skilled in the art that the teachings of the present disclosure may be practiced without these specific details. In other instances, well-known methods, procedures, components and circuits have not been described in detail so as not to obscure the teachings of the present disclosure.

The invention is described in relation to a novel slip sheet removal system that is able to remove a slip sheet from a media without damaging the delicate emulsion. The method of slip sheet removal specifically avoids causing any relative movement between the slip sheet and the media emulsion. While of particular application in removing slip sheet from a stack of media in a graphic arts imaging system, the method and apparatus of the present invention may be useful in handling other types of media particularly where the media is delicate and susceptible to damage. The term "media" should be read to include all manner of media used in imaging and printing operations including, but not limited to, plates, films, paper and coated paper.

In a particular application, lithographic plates are often shipped in boxes of 25 or more plates with thin paper slip sheets interspersed between plates. In an automatic plate handling system the stack of plates are commonly placed in an access position from which they are loaded onto the imaging engine by some manner of automated handler. The slip sheets present a problem for automatic media handling in that they must be removed prior to imaging. The removal is often complicated by electrostatic attraction between the sheet and the media surfaces. Because the slip sheet is in intimate contact with the surface of the media a removal mechanism should also allow for the ingress of air under the slip sheet as it is removed. The slip sheet removal mechanism has the task of reliably separating the sheet from the plate and removing it to a location where it can be disposed of.

It has been observed by the inventors of the present invention that emulsion damage may occur during slip sheet removal whenever the edges are dragged or the material is bunched up and/or creased. During the slip sheet removal process, the shearing action between the slip sheet and the plate becomes localized to these creased areas and scuffing or scratching may occur. Further, it has been determined that if the slip sheet can be engaged without forming creases so that it remains flat, and the engaged sheet can be lifted away from the media in substantially this condition, scuffing may be completely avoided.

A solution for removing slip sheets 120 from printing plates 124 shown in FIGS. 1-5, deploys a vacuum conveyor adapted to attach to a slip sheet 120 covering the top printing plate 124 on a printing plates. The vacuum conveyor contains brackets which are attached to the links of a commercially available energy chain 108. The brackets can be made for example from metal or plastic material. Those chains are available in various sizes and configurations. The most prominent manufacturer of these chains is IGUS (igus.com). The energy chain 108 are adapted to move back and forth as is shown by numeral 128, by rotating via the two pairs of sprockets 132 and 136. The distance between the pair of energy chains 108 is adjusted by altering the position of sprockets 132 on a spline, to comply with the width of printing plate 124. A series of vacuum cups 116 are mounted on energy chain 108. The energy chains are used to support the vacuum cups 116, and as conduits for the air tube which feeds the vacuum cups 116.

In order to prevent relative shearing motion between slip sheet and printing plate the energy chains 108, vacuum cups 116 and slip sheet separator 104 are moved together in direction 129 after the slip sheet is picked up.

Figure 2B:
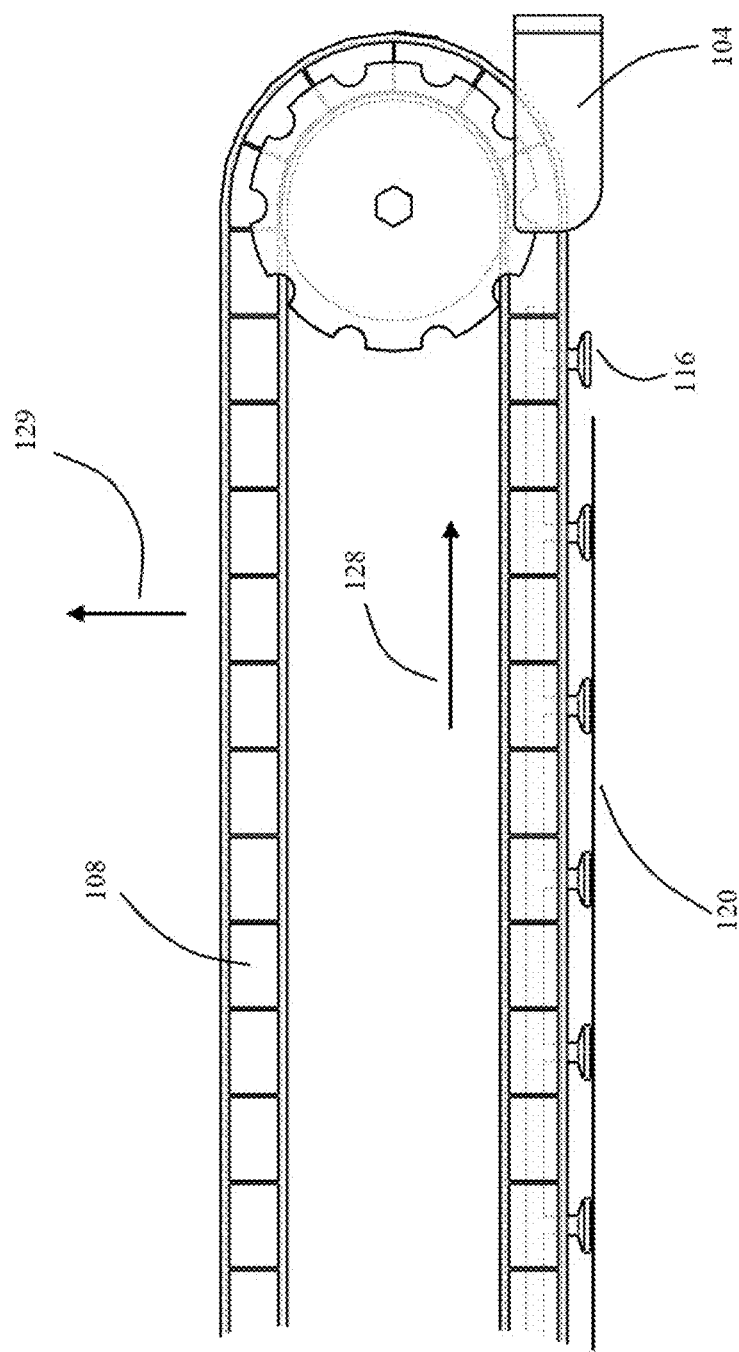
FIG. 2b shows a schematic illustration of a lightweight energy chains with plurality of vacuum cups attached to a slip sheet which is already separated from plate stack.

FIG. 2a shows a slip sheet 120 attached to vacuum cups 116 and energy chains 108. FIG. 2b shows a slip sheet attached to plurality of vacuum cups which has already been vertically separated from a plate stack. The energy chains advance in direction 128. The motion is intermittent, i.e. the vacuum cups 116 move to the right (direction 128) but once the slip sheet 120 is peeled off the cups the energy chains rotate back to their home position ready to pick another slip sheet. The vacuum is applied to vacuum cups while the slip sheet is peeled off the vacuum cups.

Continuous motion of energy chains 108 is not required; motion is applied only when a slip sheet 108 is needed to be removed from printing plate 124. In FIG. 3 it is shown how the vacuum cups 116 pick up a slip sheet 108 from the top printing plate 124 of stack 304.

FIG. 4 shows slip sheet 120 moved to the right towards slip sheet bin 404. Slip sheet 120 is peeled of vacuum cups 116 and directed to the slip sheet bin 404 by slip sheet separator 104, while the vacuum is constantly maintained during the peeling operation.

Figure 5:
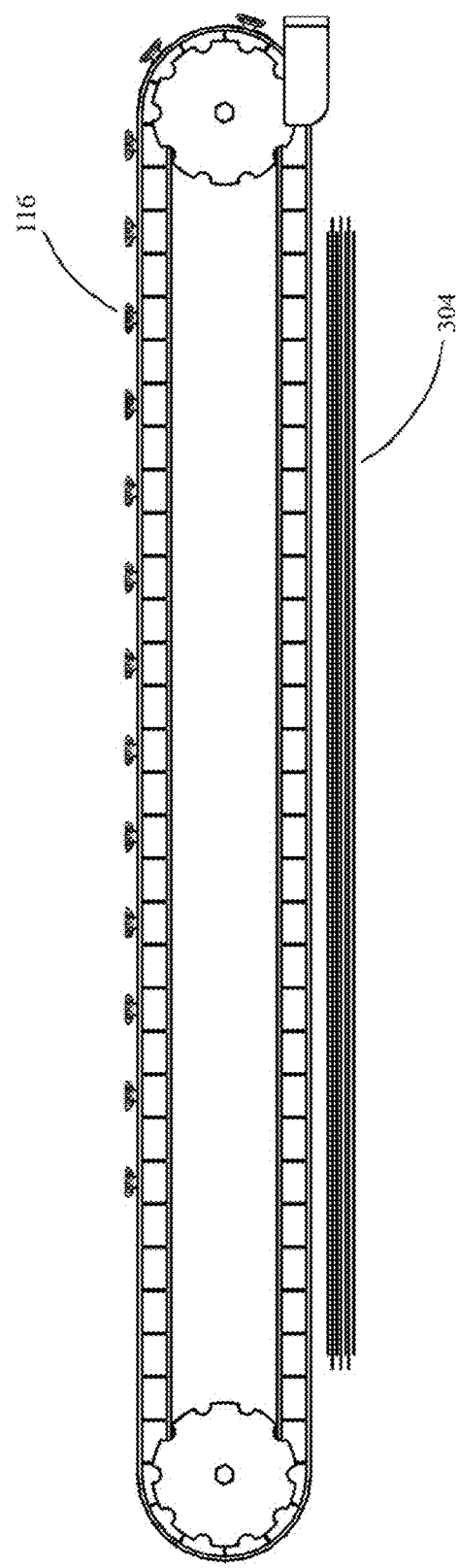
FIG. 5 shows a schematic at which the vacuum cups are brought into upper position and are switched off, readying the plate picker mechanism to pick up the a printing plate.

Once the peeling of a slip sheet is completed, the vacuum cups are brought into the upper position as is shown in FIG. 5 and the vacuum system for vacuum cups 116 is switched off. The vacuum cups 116 are brought into upper position by rotating the energy chain counter clockwise. At this stage a separate plate picking mechanism (not shown) is used to lift printing plate 124 and to bring it into an imaging device (not shown).

The invention has been described in detail with particular reference to certain preferred embodiments thereof, but it will be understood that variations and modifications can be effected within the scope of the invention.

PARTS LIST 104 slip sheet separator
108 pair of energy chains
116 vacuum cups
120 slip sheet
124 printing plate
128 energy chain intermittent movement direction
129 mechanism movement direction for plate separation.
132 pair of left side sprockets
136 pair of right side sprockets
304 printing plates stack
404 slip sheet bin

The invention claimed is:

1. A method of removing slip sheets from a stack of printing plates wherein said slip sheets are interspersed between said printing plates, comprising:
    moving at least two parallel chains, wherein each of said chains carries a plurality of vacuum cups, over said stack of printing plates;
    contacting said vacuum cups to a top slip sheet placed on top of said stack of printing plates;
    applying vacuum to said vacuum cups to attach the top slip sheet to said vacuum cups;
    peeling said top slip sheet off said vacuum cups while vacuum is maintained by moving said chains with said top slip attached to said vacuum cups away from said stack of printing plates and by a slip sheet separator to separate said top slip sheet from said vacuum cups; and
    directing said top slip sheet into a slip sheet bin using said slip sheet separator.

2. The method according to claim 1 wherein said chains are provided in plurality of sizes to match the length of said printing plate.

3. The method according to claim 1 wherein a distance between said chains matches a width of said printing plate.

4. The method according to claim 1 comprising:
    turning off vacuum after removal of slip sheet.

5. The method according to claim 4 comprising:
    picking up said plate after removal of slip sheet and moving said plate to an imaging device using separate plate picking mechanism.

6. The method according to claim 5 comprising:
    rotating said chains back into position over said stack of printing plates after removal of plate.

7. The method according to claim 6 comprising:
    restoring said vacuum.

8. The method according to claim 6 comprising:
    rotating said chains in a clockwise direction to move said vacuum cups into position over said stack of printing plates.

9. The method according to claim 6 comprising:
    rotating said chains in a counter clockwise direction to move said vacuum cups into position over said stack of printing plates.

* * * * *